(12) United States Patent
Wakisaka

(10) Patent No.: US 7,661,190 B2
(45) Date of Patent: Feb. 16, 2010

(54) PROCESS FOR PRODUCING MULTILAYER PRINTED WIRING BOARD

(75) Inventor: Yasuhiro Wakisaka, Tokyo (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 10/547,542

(22) PCT Filed: Mar. 3, 2004

(86) PCT No.: PCT/JP2004/002616

§ 371 (c)(1), (2), (4) Date: May 26, 2006

(87) PCT Pub. No.: WO2004/080141

PCT Pub. Date: Sep. 16, 2004

(65) Prior Publication Data

US 2006/0230611 A1    Oct. 19, 2006

(30) Foreign Application Priority Data

Mar. 4, 2003   (JP)   ............................. 2003-057833

(51) Int. Cl.
*H05K 3/38*   (2006.01)

(52) U.S. Cl. .................. 29/846; 174/258; 174/259; 427/97.6; 427/99.2

(58) Field of Classification Search .... 29/830.846–851; 427/97.1, 97.6–97.8, 99.2, 340, 384; 174/258, 174/259

See application file for complete search history.

(56) References Cited

U.S. PATENT DOCUMENTS

| | | | |
|---|---|---|---|
| 4,522,850 A * | 6/1985 | Leech | ...................... 427/304 |
| 6,248,428 B1 * | 6/2001 | Asai et al. | ................... 428/206 |
| 7,017,265 B2 * | 3/2006 | Tani et al. | ..................... 29/852 |

2001/0011111 A1   8/2001  Funada et al.

FOREIGN PATENT DOCUMENTS

| | | |
|---|---|---|
| JP | 10-158526 A | 6/1998 |
| JP | 10-173339 A | 6/1998 |
| JP | 10-303533 A | 11/1998 |
| JP | 2001-144436 A | 5/2001 |
| JP | 2001-192844 A | 7/2001 |
| JP | 2001-345554 A | 12/2001 |
| JP | 2003-158373 A | 5/2003 |
| JP | 2001-345554 A | 12/2004 |
| WO | WO-03/024174 A1 | 3/2003 |
| WO | WO03024174 A1 * | 3/2003 |

OTHER PUBLICATIONS

Surface Texture From Ra to Rz, http://www.mmsonline.com/articles/1102gage.html.*

* cited by examiner

*Primary Examiner*—A. Dexter Tugbang
*Assistant Examiner*—Livius R Cazan
(74) *Attorney, Agent, or Firm*—Birch, Stewart, Kolasch & Birch, LLP

(57) ABSTRACT

A process for producing a multilayer printed wiring board, comprising providing an uncured or partly-cured resin layer from a curable composition comprising an insulation polymer and a curable agent, the resin layer superimposed on an internal layer substrate having a first conductive layer as an outermost layer; bringing the surface of the resin layer into contact with a compound having a structure capable of coordination with a metal; curable the resin layer to thereby form an electrical insulation layer; oxidizing the surface of the obtained electrical insulation layer until the surface average roughness (Ra) of the electrical insulation layer falls within the range of 0.05 to less than 0.2 μm and the surface ten-point average roughness (Rzjis) thereof within the range of 0.3 to less than 4 μm; and forming a second conductive layer on the electrical insulation layer by plating operation. There is further provided a multilayer printed wiring board produced by the process. This multilayer printed wiring board excels in pattern adhesion to substrates, even those of large size.

5 Claims, No Drawings

PROCESS FOR PRODUCING MULTILAYER PRINTED WIRING BOARD

This application is a U.S. national Stage entry of International Application No. PCT/JP04/02616 filed Mar. 3, 2004, which claims priority to Japanese application number 2003-057833 filed Mar. 4, 2003.

TECHNICAL FIELD

The present invention relates to a process for producing a multilayer printed wiring board excelling in pattern adhesion and a multilayer printed wiring board produced by the process.

BACKGROUND ART

Miniaturization and functional diversification of electronic equipment are increasingly requiring high density printed wiring boards to be used for the electronic equipment.

Multilayering is a common technique for increasing the density of printed wiring boards. A multilayer printed wiring board is most commonly prepared by laminating an electrical insulation layer on the surface of an internal layer substrate of which the outermost layer is a conductive layer (a first conductive layer) and forming a new conductive layer (a second conductive layer) on the electrical insulation layer. Optionally, several electrical insulation layers and conductive layers are additionally laminated.

In this type of multilayer printed wiring board, adhesion (pattern adhesion) of the electrical insulation layer with the conductive pattern of the second conductive layer formed thereon is important to ensure a long life. A method of roughening the electrical insulation layer disclosed in Japanese Patent No. 2877110, for example, is widely employed for obtaining the pattern adhesion. Coating the roughened electrical insulation layer with an adhesive for electroless plating containing polymer components such as a rubber and resin to improve the pattern adhesion has been studied (Japanese patent Application Laid-open 2001-192844, etc.).

However, the roughening or coating with an adhesive after forming the electrical insulation layer cannot necessarily ensure sufficient pattern adhesion when there is a change in the temperature and humidity. There have been cases in which the life of multilayer printed wiring board is reduced.

DISCLOSURE OF THE INVENTION

In view of this situation of prior art technology, the present inventor has conducted extensive studies to obtain a multilayer printed wiring board which can maintain high pattern adhesion when there is a change in the temperature or humidity. As a result, the inventor has found that, when an electrical insulation layer is formed by curing a resin layer made from a curable composition containing an insulation polymer and a curing agent, the above problem can be solved by treating the surface of the resin layer with a specific compound prior to curing the composition (Japanese Patent Application No. 2002-217513). The surface of the electrical insulation layer formed using the method of this invention is very flat and smooth.

As a result of a further study, the inventor has found that even a large substrate having an area of 150 mm×150 mm or more can be uniformly adhered, if, after causing the surface of the resin layer to come in contact with a compound having a structure capable of coordinating with a metal, a conductive layer is formed after slightly roughening the electrical insulation layer to produce a surface with a surface average roughness in a specific range. This finding has led to the completion of the present invention.

Specifically, the present invention provides a process for producing a multilayer printed wiring board, comprising the steps of: causing the surface of a resin layer, which is uncured or partly-cured and made of a curable composition comprising an insulation polymer and a curing agent, to come in contact with a compound having a structure capable of coordinating with a metal, the resin layer being formed on an internal layer substrate of which the outermost layer is a first conductive layer; then curing the resin layer to form an electrical insulation layer; oxidizing the surface of the obtained electrical insulation layer until the surface average roughness (Ra) of the electrical insulation layer becomes within the range not less than 0.05 µm and less than 0.2 µm and the surface ten-point average roughness (Rzjis) thereof within the range not less than 0.3 µm and less than 4 µm;

and thereafter forming a second conductive layer on the electrical insulation layer using a plating method.

The compound having the structure capable of coordinating with the metal used in the process for producing a multilayer printed wiring board of the present invention is preferably a compound having an amino group, thiol group, carboxyl group, or cyano group, and particularly preferably a heterocyclic compound containing a nitrogen atom, an oxygen atom, or a sulfur atom, in the ring thereof.

The method of oxidizing the surface of the electrical insulation layer in the process for producing a multilayer printed wiring board of the present invention preferably comprises causing the surface of the electrical insulation layer to come in contact with a solution of an oxidizing compound selected from the group consisting of permanganates, chromates, and dichromates. When this method is used, the electrical insulation layer preferably comprises a resin and/or filler soluble in a solution of the oxidizing compound.

The process for producing a multilayer printed wiring board of the present invention preferably comprises the step of forming a metal thin film layer on the electrical insulation layer by an electroless plating method and a step of heating the metal thin film layer formed on the electrical insulation layer.

The present invention further provides the multilayer printed wiring board produced by the above process of the present invention.

BEST MODE FOR CARRYING OUT THE INVENTION

1) Process for Producing a Multilayer Printed Wiring Board

The process for producing a multilayer printed wiring board comprises the following three steps.

(Step A) A step of causing the surface of a resin layer, which is uncured or partly-cured and made of a curable composition comprising an insulation polymer and a curing agent, to come in contact with a compound having a structure capable of coordinating with a metal, the resin layer being formed on an internal layer substrate of which the outermost layer is a first conductive layer (hereinafter referred to from time to time as "a first conductive layer").

(Step B) A step of curing the resin layer to form an electrical insulation layer and oxidizing the surface of the obtained electrical insulation layer until the surface average roughness (Ra) of the electrical insulation layer becomes within the range not less than 0.05 µm and less than 0.2 µm and the surface ten-point average roughness (Rzjis) thereof within the range not less than 0.3 μm and less than 4 μm.

(Step C) A step of forming a conductive layer (hereinafter referred to from time to time as "a second conductive layer") on the electrical insulation layer using a plating method.

Each step will be described below in detail.

(Step A)

The internal layer substrate used in the step A is a substrate of which the outermost layer is a first conductive layer. The internal layer substrate most commonly comprises a formed body of an electrical insulation material (a formed electrical insulation material) and a conductive layer formed on the surface of the formed electrical insulation material.

The conductive layer is usually made of a conductive metal.

The electrical insulation material is an inorganic compound such as silicon oxide or alumina, or an organic compound such as an insulation polymer, for example, alicyclic olefin polymer, epoxy resin, maleimide resin, (meth)acryl resin, diallyl phthalate resin, triazine resin, aromatic polyether polymer, cyanate ester polymer, polyimide, and the like.

The formed electrical insulation material may contain glass fiber, resin fiber, and the like for reinforcement. The formed electrical insulation material may also have one or more inner conductive layers.

The thickness of the internal layer substrate, excluding the thickness of the outer most layer of the conductive layer is usually from 50 μm to 2 mm, preferably from 60 μm to 1.6 mm, and still more preferably from 100 μm to 1 mm.

A printed wiring board substrate, an insulation substrate, and the like can be given as specific examples of such an internal layer substrate. These substrates have a conductive layer formed on the surface of an electrical insulation layer.

An uncured or partly-cured resin layer is formed on this internal layer substrate using a curable composition containing an insulation polymer and a curing agent.

"The uncured resin layer" is a resin layer in a state, substantially entire of which is soluble in a solvent that can dissolve the insulation polymer forming the resin layer. "The partly-cured resin layer" is a resin layer in a state, that the resin is cured to the extent of further curable by heating.

In the partly-cured resin layer, either part of the insulation polymer (specifically 7 wt % or more) of the resin layer is soluble in the solvent or, when the resin layer is dipped in the solvent for 24 hours, the resin exhibits a volume swelling rate of 200% or more of the volume before dipping is preferable.

There are no specific limitations to the insulation polymer used for the curable composition insofar as the resin has electrical insulation properties. For example, epoxy resin, maleimide resin, (meth)acrylic resin, diallyl phthalate resin, triazine resin, alicyclic olefin polymer, aromatic polyether polymer, benzocyclobutene polymer, cyanate ester polymer, liquid crystal polymer, polyimide, and the like can be given.

Of these polymers, an alicyclic olefin polymer, aromatic polyether polymer, benzocyclobutene polymer, cyanate ester polymer, and polyimide are preferable. An alicyclic olefin polymer and aromatic polyether polymer are particularly preferable polymers, with a most preferable polymer being an alicyclic olefin polymer.

The alicyclic olefin polymer is a polymer of an unsaturated hydrocarbon having an alicyclic structure. As specific examples of the alicyclic olefin polymer, a ring-opening polymer of a norbornene monomer and its hydrogenated products, an addition polymer of a norbornene monomer, an addition polymer of a norbornene monomer and vinyl compound, monocyclic cycloalkene polymer, alicyclic conjugated diene polymer, vinyl alicyclic hydrocarbon polymer and its hydrogenated product, an aromatic ring hydrogenated product of an aromatic olefin polymer, and the like can be given.

Of these, a ring-opening polymer of a norbornene monomer and its hydrogenated products, an addition polymer of a norbornene monomer, an addition polymer of a norbornene monomer and vinyl compound, and aromatic ring hydrogenated product of an aromatic olefin polymer are preferable, with the hydrogenated products of the ring-opening polymer of a norbornene monomer being particularly preferable.

An alicyclic olefin polymer having a polar group is preferable. As the polar group, a hydroxyl group, carboxyl group, alkoxyl group, epoxy group, glycidyl group, oxycarbonyl group, carbonyl group, amino group, ester group, carboxylic anhydride group, and the like can be mentioned. Of these, the carboxyl group and carboxylic anhydride (carbonyloxycarbonyl) group are particularly preferable.

The alicyclic olefin polymer can be obtained by addition polymerization or ring-opening polymerization of an alicyclic olefin having a norbornene ring such as 8-ethyltetracyclo[$4.4.0.1^{2,5}.1^{7,10}$]dodeca-3-ene, tricyclo[$4.3.0.1^{2,5}$]deca-3,7-diene, or the like and optionally hydrogenating the unsaturated bonds, or by addition polymerization of an aromatic olefin and hydrogenating the aromatic ring of the resulting polymer.

The alicyclic olefin polymer having a polar group can be obtained by, for example, 1) introducing a polar group into the alicyclic olefin polymer by a modification reaction, 2) copolymerizing a monomer containing a polar group as a copolymerization component, or 3) copolymerizing a monomer containing a polar group such as an ester group as a copolymerization component and hydrolyzing the ester group after the copolymerization.

The alicyclic olefin polymer can also be obtained by the copolymerization of an alicyclic olefin and/or an aromatic olefin with a monomer copolymerizable therewith (such as 1-hexene). Although the glass transition temperature of the alicyclic olefin polymer can be appropriately selected according to the object of use, the glass transition temperature is usually 50° C. or more, preferably 70° C. or more, more preferably 100° C. or more, and most preferably 125° C. or more.

Although there are no specific limitations, the weight average molecular weight of the insulation polymer is usually 10,000-1,000,000, and preferably 50,000-500,000. For easy control of the degree of roughness of the electrical insulation layer by oxidation treatment, the amount of the polymer having the weight average molecular weight of 10,000-1,000,000 is preferably 20 parts by weight or more, and more preferably 30 parts by weight or more for 100 parts by weight of the insulation polymer components contained in the curable composition.

In the present invention, the weight average molecular weight (Mw) is determined by gel permeation chromatography (GPC) as a value expressed in terms of polystyrene or polyisoprene.

There are no specific limitations to the curing agent used, insofar as the curing agent is capable of crosslinking and curing the polymer by heating. As the curing agent, known heat curing agents such as an ionic curing agent, radical curing agent, a curing agent having both ionic and radical characteristics, and the like can be used. Particularly preferable curing agents are polyvalent epoxy compounds such as a glycidyl ether epoxy compound (e.g bisphenol A bis(propylene glycol glycidyl ether)ether), alicyclic epoxy compound, glycidyl ester epoxy compound, and the like.

The amount of the curing agent is 1-100 parts by weight, preferably 5-80 parts by weight, and more preferably 10-50 parts by weight, for 100 parts by weight of the insulation polymer.

Combined use of a curing promoter and the curing agent makes it easy to obtain a high heat resistant electrical insulation film. For example, when a polyvalent epoxy compound is used as the curing agent, a tertiary amine compound such as a triazole compound and imidazole compound, as well as a trifluoroboron complex can be used as a curing promoter.

When a method of causing the surface of the electrical insulation layer to come into contact with a solution of an oxidizing compound (oxidation treatment solution) is employed in the oxidation of the electrical insulation layer in step B, the curable resin composition preferably contains a resin component or filler soluble in the oxidation treatment solution. The resin component soluble in the oxidation treatment solution will be discussed in detail in the description of step B.

Other components can be added to the curable composition of the present invention, as required. As examples of the other components, a flame retardant, soft polymer, heat resistant stabilizer, weather resistant stabilizer, aging preventive, leveling agent, antistatic agent, slipping agent, anti-blocking agent, anti-clouding agent, lubricant, dye, pigment, natural oil, synthetic oil, wax, emulsion, filler, magnetic material, dielectric adjusting agent, toughness increasing agent, and the like can be given. The amount of these other components to be added is appropriately determined from a range not impairing the effect of the present invention.

Preparing a varnish of a curable composition by mixing the above-described components of the curable composition with a liquid medium is advisable because of easy formation of resin layers. As examples of the solvent used for preparing the varnish, aromatic hydrocarbon organic solvents such as toluene, xylene, ethylbenzene, and trimethylbenzene; aliphatic hydrocarbon organic solvents such as n-pentane, n-hexane, and n-heptane; alicyclic hydrocarbon organic solvents such as cyclopentane and cyclohexane; halogenated hydrocarbon organic solvents such as chlorobenzene, dichlorobenzene, and trichlorobenzene; ketone organic solvents such as methyl ethyl ketone, methyl isobutyl ketone, cyclopentanone, and cyclohexanone; and the like can be given.

There are no specific limitations to the method of obtaining the varnish. The varnish can be obtained by, for example, mixing the components of the curable composition with an organic solvent. A common method of mixing can be used for mixing the components. Stirring using a stirring bar or a magnetic stirrer, a method of using a high speed homogenizer, dispersion, planetary mixer, two-axis stirrer, ball mill, three-way roller, and the like can be given as examples. The mixing operation may be carried out at a temperature range in which the reaction by the curing agent does not affect processability, and preferably, to ensure safety, below the boiling point of the organic solvent used in the mixing operation.

The amount of solvent is appropriately selected according to the purpose such as thickness control, improvement of flatness, and the like. The amount of solvent is determined so that the solid content of the varnish is usually 5-70 wt %, preferably 10-65 wt %, and still more preferably 20-60 wt %.

There are no specific limitations to the method of forming an uncured or partly-cured resin layer on an internal layer substrate. For example, a method (A1) of forming a resin layer by causing a formed film or sheet of a curable composition containing an insulation polymer and a curing agent to adhere to the conductive layer of the internal layer substrate, a method (A2) of applying a varnish of the curable composition containing an insulation polymer and a curing agent to the internal layer substrate and drying the applying to obtain an uncured or partly-cured resin layer, and the like can be given. Of these methods, the method (A1) is preferable because of high in-plane adhesion uniformity with a metal thin film layer to be formed on the electrical insulation layer which is obtained by curing the resin layer.

When forming the uncured or partly-cured resin layer using the method (A1), it is preferable to pretreat the surface of the internal layer substrate on which a conductive layer has been formed before applying a formed film or sheet of the curable composition to improve adhesion of the conductive layer on the surface of the internal layer substrate and electrical insulation layer.

A known method can be used for pretreatment without specific limitations. For example, in the case in which the conductive layer on the surface of the internal layer substrate is made of copper, (i) an oxidation method of roughening the surface of the first conductive layer by causing a strong alkali oxidizing solution to come in contact with the surface of the internal layer substrate to form a layer of clustered copper oxide on the surface of the first conductive layer, (ii) a method of oxidizing the surface of the first conductive layer using the above method (i), followed by reduction using sodium borohydride, formalin, or the like, (iii) a method of roughening the first conductive layer by depositing a plating metal, (iv) a method of roughening the first conductive layer by causing this layer to come in contact with an organic acid, thereby causing copper grain boundaries to deposit, (v) a method of forming a primer layer using a thiol compound, a silane compound, and the like can be given. Among these methods, the methods (iv) or (v) are preferable due to easy retention of detailed circuit pattern configurations.

The thickness of the formed film or sheet of the curable composition used in the method (A1) is usually 0.1-150 μm, preferably 0.5-100 μm, and still more preferably 1-80 μm.

This formed film or sheet is usually prepared from the curable composition by a solution casting method, a melting casting method, and the like. In the solution casting method, a varnish is applied to a supporting body and the solvent is removed by drying.

As the supporting body used in the solution casting method, a resin film (carrier film), a metal foil, and the like can be given.

As the resin film, a thermoplastic resin film is most commonly used. As specific examples, a polyethyleneterephthalate film, polypropylene film, polyethylene film, polycarbonate film, polyethylenenaphthalate film, polyallylate film, nylon film, and the like can be given. Of these, a polyethylene terephthalate film or a polyethylene naphthalate film is preferable from the viewpoint of heat resistance, chemical resistance, removability after lamination, and the like.

As examples of the metal foil, a copper foil, aluminum foil, nickel foil, chromium foil, gold foil, silver foil, and the like can be given. Of these, copper foil, in particular electrodeposited copper foil or rolled copper foil is preferable from the viewpoint of excellent conductivity and low cost.

Although there are no specific limitations, the thickness of the supporting body is usually 1-150 μm, preferably 2-100 μm, and still more preferably 3-50 μm from the viewpoint of workability and the like. Average surface roughness (Ra) of the supporting body is usually 300 nm or less, preferably 150 nm or less, and still more preferably 100 nm or less. If the surface roughness (Ra) of the supporting body is large, the average surface roughness (Ra) of the electrical insulation layer is too large to form fine conductor patterns.

As a method of applying the varnish of the curable composition to the supporting body, a dip coating method, roll coating method, curtain coating method, die coating method, slit coating method, and the like can be given. The conditions for removal of the organic solvent by drying are appropriately selected according to the type of solvent. The drying temperature is usually 20-300° C., and preferably 30-200° C. The drying time is usually 30 seconds to one hour, and preferably one minute to 30 minutes.

In the method (A1), there are no specific limitations to the method of laminating the formed film or sheet of the curable composition on the substrate. For example, a method of superposing a formed film or sheet with a supporting body over the conductive layer so that the film or sheet is brought to come in contact with the conductive layer, heat pressing (laminating) the substrate and the film or sheet using a pressure machine such as a pressure laminating machine, press, vacuum laminating machine, vacuum press, or roll laminating machine so that there are no substantial voids in their interface can be given.

The heat-pressing is preferably carried out under vacuum to improve filling of wiring apace and to suppress generation of bubbles and the like. The heat-pressing is preferably carried out at a temperature of usually 30-250° C., preferably 70-200° C., under pressure of usually 10 kPa-20 MPa, and preferably 100 kPa-10 MPa, for a period of time usually from 30 seconds to 5 hours, and preferably from one minute to 3 hours, under reduced atmospheric pressure of usually 100 kPa-1 Pa, and preferably 40 kPa-10 Pa.

Two or more sheets of formed material (films or sheets) may be laminated to the internal layer substrate. For example, to improve evenness or to increase the thickness of the electrical insulation layer, after a formed film or sheet has been applied to the internal layer substrate, another formed film or sheet may be applied onto the previously applied film or sheet. When two or more sheets of the formed material are adhered and laminated to the internal layer substrate, the surface of the lastly laminated sheet or film is caused to come in contact with a compound having a structure capable of coordinating with a metal.

When an uncured or partly-cured resin layer is formed by the method (A2), a varnish of the curable composition can be directly applied to the internal layer substrate and dried. The same method and conditions as mentioned in the method of forming a film or sheet from the curable composition can be used for the coating and drying in the method (A2).

In the step A, a compound having a structure capable of coordinating with a metal is caused to come in contact with the surface of the uncured or partly-cured resin layer formed on the internal layer substrate. In the case in which the resin layer is formed by causing a film or sheet of a curable composition formed on a supporting body to adhere to the internal layer substrate, this step is carried out after removing the supporting body.

As the compound having a structure capable of coordinating with a metal (hereinafter referred to from time to time as "coordinating structure-containing compound"), a compound having a functional group capable of coordinating with a metal such as an amino group, thiol group, carboxyl group, and cyano group, and a compound having unshared electron pairs such as a heterocyclic compound capable of coordinating with a metal can be given. Of these, a heterocyclic compound having a nitrogen atom, an oxygen atom, or a sulfur atom in the ring thereof is preferable, with a particularly preferably heterocyclic compound being a nitrogen-containing heterocyclic compound. Such a heterocyclic compound may further contain another functional group capable of coordinating with a metal. Such a heterocyclic compound containing another functional group capable of coordinating with a metal is preferable due to the capability of providing a higher pattern adhesive properties.

As specific examples of the coordinating structure-containing compound, imidazoles such as imidazole, 2-methylimidazole, 2-ethyl-4-methylimidazole, 2-mercaptomethyl benzimidazole, 2-ethylimidazole-4-dithiocarboxylic acid, 2-methylimidazole-4-carboxylic acid, 1-(2-aminoethyl)-2-methylimidazole, 1-(2-cyanoethyl)-2-methylimidazole, 2-phenyl-4,5-dihydroxymethylimidazole, enzimidazole, and 2-ethyl-4-thiocarbamoylimidazole; pyrazoles such as pyrazole and 3-amino-4-cyanopyrazole; triazoles such as 1,2,4-triazole, 2-amino-1,2,4-triazole, 1,2-diamino-1,2,4-triazole, and 1-mercapto-1,2,4-triazole; triazines such as 2-aminotriazine, 2,4-diamino-6-(6-(2-(2-methyl-1-imidazolyl)ethyl) triazine, and 2,4,6-trimercapto-s-triazine-trisodium salt); and the like can be given. These compounds are preferable because of their capability of reacting with components in the curable resin composition and being firmly retained on the surface of the resin substrate which is formed at the following step B.

The coordinating structure-containing compound can increase the crosslinking density and hydrophilic properties on the surface of the resin layer when the resin layer is cured. Therefore, not only the strength of the electrical insulation layer can be maintained by oxidizing the surface of the electrical insulation layer, which is discussed in detail below, but also the resin and filler soluble in the oxidation treatment solution contained in the electrical insulation layer can be easily removed.

There are no specific limitations to the method of causing the coordinating structure-containing compound to come in contact with the surface of the uncured or partly-cured resin layer. For example, a dipping method comprising dissolving the coordinating structure-containing compound in water or an organic solvent and dipping the inner layer substrate on which the resin layer has been formed in this solution, a spraying method of applying this solution onto the surface of the formed material of the inner layer substrate on which the resin layer has been formed by spraying, and the like can be given. The above contacting operation may be carried out once or may be repeated two or more times.

When the coordinating structure-containing compound is dissolved in a solvent, there are no specific limitations to the solvent to be used. A solvent that cannot easily dissolve the resin layer after lamination, but can dissolve the coordinating structure-containing compound is appropriately selected. For example, water, ethers such as tetrahydrofuran, alcohols such as ethanol and isopropanol, ketones such as acetone, polar solvents such as cellosolves (e.g. ethylcellosolve acetate), and a mixture of these solvents can be used.

Although there are no specific limitations to the concentration of the coordinating structure-containing compound in the solution thereof, the concentration is usually from 0.001 to 70 wt %, and preferably from 0.01 to 50 wt % from the viewpoint of easy operation of this step.

Needless to mention, the coordinating structure-containing compound which is liquid at an operating temperature can be used as is without dissolving in a solvent, inasmuch as there is no problem in the operation of causing the coordinating structure-containing compound to come in contact with the surface of the uncured or partly-cured resin layer.

The solution of the coordinating structure-containing compound used in the present invention contains the above-mentioned coordinating structure-containing compound as the main component, but may contain components other than the coordinating structure-containing compound. As the other components, a surfactant to improve wettability of the uncured or partly-cured resin layer with the coordinating structure-containing compound solution, and other additives can be given. To ensure good adhesiveness, these additives are used in an amount of usually 10 wt % or less, preferably 5 wt % or less, and more preferably 1 wt % or less of the amount of the coordinating structure-containing compound.

The temperature at which the coordinating structure-containing compound is caused to come in contact with the surface of the resin layer can be appropriately determined taking the boiling point, melting point of the coordinating structure-containing compound or its solution, operability, productivity, and the like into consideration from the range usually of 10 to 100° C., and preferably 15 to 65° C. The contact time can be appropriately determined according to the amount of the coordinating structure-containing compound to be adhered to the surface of the formed body, the concentration of the solution, productivity, and the like usually from the range of 0.1 to 360 minutes, and preferably 0.1 to 60 minutes.

After the contacting operation, an excess amount of the coordinating structure-containing compound is removed by (a) washing with water, (b) blowing an inert gas such as nitrogen onto the contact surface, or (c) drying in an oven at a temperature usually from 30-180° C., and preferably from 50-150° C., for usually one minute or more, and preferably for 5-120 minutes. The above treatments can be carried out in combination of two or more, in which case performing these treatments in the order of (a), (b), and (c) is particularly preferable.

(Step B)

Following the step A, the uncured or partly-cured resin layer of which the surface has been caused to come in contact with the compound capable of coordinating a metal is cured to form an electrical insulation layer.

Curing is usually carried out by heating the resin layer (the entire internal layer substrate in which the resin layer has been formed).

Curing conditions are appropriately selected according to the type of curing agent. The curing temperature is usually 30-400° C., preferably 70-300° C., and more preferably 100-200° C. and the curing time is usually 0.1-5 hours, and preferably 0.5-3 hours. There are no specific limitations to the heating method. For example, an oven is used for heating.

Usually, when forming a multilayer printed wiring board, an opening for forming a via-hole is formed in the electrical insulation layer before forming a metal thin film layer to connect the first conductive layer with the second conductive layer which is formed later. This opening for the via-hole formation can be formed by a chemical process such as a photolithographic method or a physical process using a drill, a laser, plasma etching, and the like. The method of using laser such as a carbon dioxide laser, excimer laser, and UV-YAG laser is preferable from the viewpoint of forming finer via-holes without impairing characteristics of the electrical insulation layer. Therefore, the electrical insulation layer used for the following step C usually has an opening for via-hole formation.

In the step B, the surface of the electrical insulation layer is oxidized to adjust the surface average roughness (Ra) and the surface ten point average roughness (Rzjis) to desired values.

In the present invention the surface average roughness (Ra) of the electrical insulation layer is not less than 0.05 μm and less than 0.2 μm, and preferably not less than 0.06 μm and less than 0.1 μm, and the surface ten-point average roughness (Rzjis) is not less than 0.3 μm and less than 4 μm, and preferably not less than 0.5 μm and less than 2 μm.

Here, the surface average roughness (Ra) is the centerline average roughness indicated in JIS B 0601-2001, and the surface ten point average roughness (Rzjis) is the ten-point average roughness indicated in JIS B 0601-2001.

Usually, since oxidation of the surface of an electrical insulation layer weakens the treated surface, it is difficult to provide sufficient adhesion with a metal. In the present invention, however, a strong and fine surface of electrical insulation layer can be obtained by causing the surface to come in contact with the compound capable of coordinating with a metal before the oxidation treatment.

In the present invention, the oxidation on the surface of an electrical insulation layer is carried out by causing the surface of the electrical insulation layer to come in contact with an oxidizing compound.

As the oxidizing compound to be used, known compounds possessing oxidizing capability such as an inorganic peroxide and organic peroxide, oxidizing gas, and the like can be given. Use of an inorganic peroxide or organic peroxide is preferable due to easy control of the surface average roughness of the electrical insulation layer.

As the inorganic peroxide, manganese compounds such as permanganate and active manganese dioxide; chromium compounds such as chromic anhydride, dichromate, and chromate; osmium compounds such as osmium tetroxide; persulfate; hydrogen peroxide; periodate; ozone; and the like can be given.

As the organic peroxide, dicumyl peroxide, octanoyl peroxide, m-chloroperbenzoic acid, peracetic acid, and the like can be given.

There are no specific limitations to the method for oxidizing the surface of electrical insulation layer using an oxidizing compound. A common method such as a method of preparing a solution of an oxidizing compound by dissolving these oxidizing compounds in liquid medium which can dissolve these compounds and causing the solution to come in contact with a cured resin substrate can be given, for example.

As the medium used for dissolving the oxidizing compound, neutral water, alkaline water solutions such as a sodium hydroxide aqueous solution, acidic solutions such as a sulfuric acid aqueous solution, non-polar organic solvents such as ether and petroleum ether, polar organic solvents such as acetone and methanol, and the like can be given.

There are no specific limitations to the method of causing the oxidizing compound or the solution thereof to come into contact with the surface of the electrical insulation layer. Any methods such as a dipping method in which the electrical insulation layer is dipped in the solution of an oxidizing compound, a solution loading method in which the solution of an oxidizing compound is superimposed on the electrical insulation layer using surface tension, a spraying method of atomizing the solution of an oxidizing compound onto a substrate, and the like can be used.

The temperature and time for causing the oxidizing compound to come in contact with the surface of the electrical insulation layer can be arbitrarily determined taking the concentration and type of the oxidizing quality compound, the contact method, and the like into consideration. The contact is carried out at a temperature of usually 10-250° C., and preferably 20-180° C. for usually 0.5-60 minutes, and preferably 1-30 minutes. The temperature and contact time in this range ensures easy control of the degree of roughness on the surface of an electrical insulation layer, easy removal of a brittle layer on the surface of the electrical insulation layer and adhering contaminants originating from the atmosphere, and easy control of the surface of the electrical insulation layer to prevent the layer from becoming brittle.

As an oxidation treatment method using a gaseous medium, a known method of plasma treatment such as reverse sputtering and corona discharge in which the medium can be converted into radicals or be ionized can be used. As examples of the gaseous medium, air, oxygen, nitrogen, argon, water, carbon disulfide, carbon tetrachloride, and the like can be given. In the case in which the medium is a liquid in the treating temperature atmosphere, the oxidation treatment is carried out after the medium is evaporated under reduced pressure. In the case in which the medium is a gas in the treating temperature atmosphere, the oxidation treatment is carried out after applying pressure to a level that can convert the medium into radicals or ionize the medium. The temperature and time for causing plasma to come in contact with the surface of an electrical insulation layer can be determined taking the type, flow rate, and the like of the gas, usually from the range of 10-250° C., preferably 20-180° C., for usually 0.5-60 minutes, and preferably 1-30 minutes.

When oxidizing the surface of an electrical insulation layer using a solution of such an oxidizing compound, it is preferable to add a resin or filler soluble in the solution of the oxidizing compound to the curable resin composition that forms the electrical insulation layer. This ensures easy control of the surface average roughness within the above-mentioned range.

A resin which can form a fine, sea island-like structure with the component such as an insulation polymer forming the electrical insulation layer and is soluble in the solution of the oxidizing compound can be appropriately selected. This resin can be used as part of the insulation polymer. As specific examples of the resin, liquid epoxy resin, polyester resin, bismaleimide-triazine resin, silicone resin, polymethyl methacrylate, natural rubber, styrene rubber, isoprene rubber, butadiene rubber, ethylene rubber, propylene rubber, urethane rubber, butyl rubber, silicone rubber, nitrile rubber, fluororubber, norbornene rubber, ether rubber, and the like can be given.

The amount of the resin soluble in the solution of the oxidizing compound is not specifically limited and can be selected from the range of 1-30 parts by weight, preferably 3-25 parts by weight, and more preferably 5-20 parts by weight, for 100 parts by weight of the insulation polymer. The amount of the resin in this range ensures fine surface roughness and uniform adhesiveness.

A filler soluble in the selected type of the oxidizing compound solution can be appropriately selected. Either an inorganic filler or organic filler can be used.

As the inorganic filler, calcium carbonate, magnesium carbonate, barium carbonate, zinc oxide, titanium oxide, magnesium oxide, magnesium silicate, calcium silicate, zirconium silicate, hydrated alumina, magnesium hydroxide, aluminum hydroxide, barium sulfate, silica, talc, clay, and the like can be given. Of these, calcium carbonate and silica are suitable for obtaining a surface with fine roughness due to their capability of producing fine particles and being easily soluble in a filler-dissolvable aqueous solution. The inorganic fillers may be treated with a silane coupling agent or an organic acid such as stearic acid.

As examples of the organic filler, particles of epoxy resin, polyester resin, bismaleimide-triazine resin, silicone resin, polymethyl methacrylate, natural rubber, styrene rubber, isoprene rubber, ethylene rubber, propylene rubber, urethane rubber, butyl rubber, silicone rubber, nitrile rubber, fluororubber, norbornene rubber, ether rubber, and the like can be given.

Non-conductive filler which does not reduce the dielectric properties of the electrical insulation layer is preferable. There are no specific limitations to the form of the filler. Although globular fillers, fibrous fillers, and plate-like fillers may be used, fine particulate fillers are preferable to obtain a finely roughened surface.

The average particle diameter of the fillers is in the range of 0.008 µm or more, but less than 2 µm, preferably 0.01 µm or more, but less than 1.5 µm, and particularly preferably 0.02 µm or more, but less than 1 µm. If less than 0.008 µm, uniform adhesiveness of a large substrate cannot be obtained. If 2 µm or more, roughness on the surface of the electrical insulation layer may be too great to provide high density wiring.

The amount of the filler can be determined according to the degree of roughness required usually from the range of 1-80 parts by weight, preferably 3-60 parts by weight, and more preferably 5-40 parts by weight, for 100 parts by weight of the insulation polymer. The amount of the filler in this range ensures fine surface roughness and uniform adhesiveness.

The filler can be used as part of a flame retardant, heat resistant stabilizer, dielectric property adjusting agent, and toughness improver to be added to the curable resin composition.

After the oxidation treatment, the surface of the electrical insulation layer is usually washed with water to remove the oxidizing compound. If a substance that cannot be washed out with water remains attached to the surface of the electrical insulation layer, the surface may be washed with another washing solution which can dissolve that substance or the substance may be caused to come in contact with another compound that can convert the substance into a water-soluble substance. The converted water-soluble substance is then washed with water. For example, when an alkaline aqueous solution such as a potassium permanganate aqueous solution or a sodium permanganate aqueous solution is caused to come in contact with a resin substrate, the surface is neutralized and reduced using an acidic aqueous solution such as a mixed solution of hydroxylamine sulfate and sulfuric acid to remove a film of manganese dioxide that has been produced. A surfactant and a polarity adjusting agent such as alcohol or ether may be used in the washing solution to ensure sufficient washing. When the surfactant or polarity adjusting agent is used, however, it is desirable again to wash the surface to remove these additives from the surface.

(Step C)

In the present invention, a metal thin film layer is formed after forming the electrical insulation layer of which the surface is oxidized to adjust the surface average roughness. A second conductive layer is formed on the surface of the electrical insulation layer and the inner wall surface of the opening for via-hole formation by a plating method.

As a method for forming the second conductive layer by the plating method, a method comprising forming a metal thin film layer on an the electrical insulation layer or on both the electrical insulation layer and the internal layer substrate by an electroless plating method, forming a resist pattern for plating on the metal thin film layer, forming the metal thin film layer into a pattern by the electrolysis plating method using the metal thin film layer, removing the resist, and removing the metal thin film by etching the metal can be given.

When a metal thin film layer is formed by the electroless plating method, it is a common practice to cause catalyst nuclei such as silver, palladium, zinc, or cobalt to be adsorbed in the metal thin film layer before forming the metal thin film layer on the surface of the electrical insulation layer.

There are no specific limitations to the method of attaching the catalyst nuclei to the electrical insulation layer. A method of dipping the electrical insulation layer substrate in a solution of a metal compound (a salt or complex) such as silver, palladium, zinc, and cobalt in water or an organic solvent such as alcohol or chloroform at a concentration of 0.001-10 wt %, and reducing the metal can be given, for example. The solution may optionally contain an acid, alkali, complexing agent, and reducing agent.

A known autocatalysis-type electroless plating solution can be used as the electroless plating solution. There are no specific limitations to the types of the metal, reducing agent, and complexing agent contained in the plating solution and the pH, the dissolved oxygen concentration, and the like of the solution. For example, an electroless copper plating solution using ammonium hypophosphate, hypophosphorous acid, a ammonium borohydride, hydrazine, formalin, or the like as a reducing agent, an electroless nickel-phosphorus plating solution using sodium hypophosphite as a reducing agent, an electroless nickel-boron plating solution using dimethylamine borane as a reducing agent, an electroless palladium plating solution, an electroless palladium-phosphorus plating solution using sodium hypophosphite as a reducing agent, an electroless gold plating solution, an electroless silver plating solution, an electroless nickel-cobalt-phosphorus plating solution using sodium hypophosphite as a reducing agent, and the like can be used.

After forming a metal thin film layer, the substrate surface can be treated with a rust preventive to protect the surface from rusting.

Usually, a second conductive layer is completed by providing thick plating on the metal thin film layer obtained in this manner. As a method for providing thick plating, a method comprising forming a plating resist on the metal thin film layer according to a conventional method, forming a plate on the resist by a wet plating method such as electrolysis plating, removing the resist, and etching the metal thin film layer to form a desired pattern is employed, for example, whereby the second conductive layer can be obtained. Therefore, the second conductive layer usually consists of a patterned metal thin film layer and plating grown on the metal thin film layer.

In the present invention, the metal thin film layer may be heated after formation or after thick plating. Heating the metal thin film layer can improve adhesiveness. The heating temperature of the metal thin film layer is usually from 50-350° C., and preferably from 80-250° C.

Heating may be carried out under pressure. As the method for applying pressure, physical application of pressure to the substrate using a heat press machine, a heat press roller, or the like can be given, for example. The pressure applied is usually 0.1-20 MPa, and preferably 0.5-10 MPa. The pressure in this range ensures high adhesion of the metal thin film with the electrical insulation layer.

Further multi-layering is possible by repeating the step A to step C using the multilayer printed wiring board thus obtained as an internal layer substrate.

2) Multilayer Printed Wiring Board

The multilayer printed wiring board obtained by the process of the present invention has uniform in-plane adhesiveness even when a large substrate having an area of 150 mm×150 mm or more is used.

Therefore, the multilayer printed wiring board of the present invention can be used in electronic equipment such as a computer and cellular phone as a substrate for mounting semiconductor devices such as a CPU and memory, and other mounting parts. The multilayer printed wiring board having minute wiring is particularly suitable as a substrate for a high density printed circuit board, a high speed computer, and a personal digital terminal used in a high frequency region.

EXAMPLES

The present invention will now be described in more detail by way of examples and comparative examples. The unit "parts" and "%" referred to in the Examples is on the weight basis unless otherwise noted.

The evaluation methods are as follows:

(1) Molecular Weight (Mw, Mn)

The molecular weight was measured by gel permeation chromatography (GPC) using toluene as a solvent expressed in terms of polystyrene.

(2) Hydrogenation Ratio and (Anhydrous) Maleic Acid Residue Content

The hydrogenation ratio to the number of moles of unsaturated bonds in the polymer before hydrogenation and the ratio of the number of moles of (anhydrous) maleic acid residue to the total number of monomer units in the polymer (carboxyl group content) were calculated from measurement results of $^1$H-NMR.

(3) Glass Transition Temperature (Tg)

The glass transition temperature was measured by differential scanning calorimetry (DSC) method.

(4) Evaluation of Surface Average Roughness (Ra)

The surface average roughness (Ra) was evaluated by inspecting surface conditions at five 20 μm×20 μm square regions using a non-contact optical surface configuration measuring apparatus ("VK-8500" a color laser beam microscope manufactured by Keyence, Inc.). The average of the five square regions was regarded as the average roughness (Ra) on the resin surface.

(5) Evaluation of Surface Ten Point Average Roughness (Rzjis)

The surface ten point average roughness (Rzjis) was evaluated by inspecting surface conditions at five 20 μm×20 μm square regions using a non-contact optical surface configuration measuring apparatus ("VK-8500" a color laser beam microscope manufactured by Keyence, Inc.).

(6) Evaluation of Adhesiveness

A total of 12 peeling patterns for evaluation of the peeling strength of an 80 mm conductor specified in JIS C 5012 8.1 were formed at four points in the outermost layer of a 150 mm×150 mm square multilayer substrate for evaluation. After leaving this multilayer substrate for 24 hours in the atmosphere of a temperature of 25° C. and 65% RH, the peeling strength was tested according to JIS C 5012 8.1 for a length of 50 mm for each conductor. The peeling strength of the total 12 conductors was measured.

The evaluation criteria were as follows.

A: The number of conductors in which the region of less than 0.4 kN/m generated for 4 mm or more was one or more, but less than three out of 12 conductors, with the average of the peeling strength being more than 0.6 kN/m.

C: The number of conductors in which the region of less than 0.4 kN/m generated for 4 mm or more was one or more, but less than three out of 12 conductors, with the average of the peeling strength being more than 0.4 kN/m.

No good: The number of conductors in which the region of less than 0.4 kN/m generated for 4 mm or more was three or more out of 12 conductors, or with the average of the peeling strength being 0.4 kN/m or less.

(6) Evaluation of Patterning Capability 50 circuit patterns, with each wire having a width of 30 μm, a distance between the wires of 30 m, and a length of 5 cm, were formed. A sample with no configuration turbulence in all of the 50 patterns was evaluated as A, a sample with configuration turbulence in some patterns, but with no defect was evaluated as B, and a sample with a defect was evaluated as C.

Example 1

8-Ethyl-tetracyclo[4.4.0.1$^{2,5}$.1$^{7,10}$]-dodeca-3-ene was subjected to ring-opening polymerization, and hydrogenated to obtain a hydrogenated polymer with a number average molecular weight (Mn) of 31,200, weight average molecular weight (Mw) of 55,800, and Tg of about 140° C. The hydrogenation ratio of the resulting polymer was 99% or more.

100 parts of the resulting polymer, 40 parts of maleic anhydride, and 5 parts of dicumyl peroxide were dissolved in 250 parts of t-butylbenzene. The mixture was reacted at 140° C. for six hours. The reaction product was precipitated by pouring the reaction solution into 1,000 parts of isopropyl alcohol to obtain a maleic acid modified hydrogenated polymer. The maleic acid modified hydrogenated polymer was dried at 100° C. for 20 hours under vacuum. The Mn and Mw of the maleic acid modified hydrogenated polymer were respectively 33,200 and 68,300. The Tg of the maleic acid modified hydrogenated polymer was 170° C. (Anhydrous) maleic acid group content was 25 mol %.

100 parts of the modified hydrogenated polymer, 40 parts of bisphenol A bis(propylene glycol glycidyl ether)ether, 5 parts of 2-[2-hydroxy-3,5-bis(α,α-dimethylbenzyl)phenyl] benzotriazole, 0.1 part of 1-benzyl-2-phenylimidazole, and 10 parts of liquid polybutadiene ("B-1000" manufactured by Nippon Petrochemicals, Co., Ltd.) as a resin soluble in an oxidation treatment solution, were dissolved in a mixed solvent of 215 parts of xylene and 54 parts of cyclopentanone to obtain varnish of a curable resin composition.

The varnish was coated onto a polyethylenenaphthalate film (supporting body) with a size of 300 mm×300 mm, a thickness of 40 μm, and a surface average roughness (Ra) of 0.08 μm using a dye coater and dried for 10 minutes in a nitrogen oven at 120° C. to obtain a formed film of a curable resin composition with a supporting body. The thickness of the film formed was 35 μm.

A both-sided copper clad substrate (a core material is made from glass cloth impregnated with a varnish containing glass filler and a halogen-free epoxy resin) with a dimension of 150 mm×150 mm and a thickness of 0.8 mm, in which an internal circuit with a wire width and a distance between the wires of 50 μm and a conductor thickness of 18 μm has been formed (of which the surface has been microetched with an organic acid) was used as an internal layer substrate. The above dry film with a carrier film, cut into a square of 150 mm×150 mm, was superimposed on both sides of the both-sided copper clad substrate, so that the resin side of the film may face the copper clad substrate. The dry films were bonded to the copper clad substrate by heat-pressing at a temperature of 11 0° C. and a pressure of 0.5 MPa for 60 seconds using a vacuum laminator having pressing plates made of heat-resistant rubber on top and bottom while reducing the atmosphere to 200 Pa (primary pressing). The dry films were then bonded to the internal layer substrate by heat-pressing at a temperature of 140° C. and a pressure of 1.0 MPa for 60 seconds using a vacuum laminator having pressing plates made of heat-resistant rubber covered with a metal pressing plate on top and bottom while reducing the atmosphere to 200 Pa (secondary pressing). Then, the supporting body was removed to obtain a resin layer on the internal layer substrate.

The substrate surface was dipped in a 0.3% 1-(2-aminoethyl)-2-methylimidazole aqueous solution at 30° C. for 10 minutes, then was dipped in water at 25° C. for one minute. A surplus amount of solution was removed with an air knife. The resin layer was cured in a nitrogen oven at 170° C. for 60 minutes to form an electrical insulation layer on the internal layer substrate.

A via-hole of interlayer connection with a diameter of 30 μm was formed in the resulting electrical insulation layer using a UV-YAG laser (third harmonic wave) to obtain a multilayer substrate with a via-hole.

The multilayer substrate with a via-hole was dipped in an aqueous solution of permanganic acid (concentration: 60 g/l) and sodium hydroxide (concentration: 28 g/l) at 70° C. for 10 minutes while shaking. The substrate was dipped in a water bath for one minute while shaking and in another water bath for one minute while shaking, whereby the substrate was washed with water. The substrate was then dipped in an aqueous solution of hydroxylamine sulfate (concentration: 170 μl) and sulfuric acid (concentration: 80 g/l) at 25° C. for 5 minutes to neutralize and reduce, and washed with water.

As a pretreatment, the multilayer substrate after washing was dipped in a Pd salt—containing plating catalyst solution containing Activator MAT-1-A (manufactured by C. Uyemura & Co., Ltd.) (concentration: 200 ml/l), Activator MAT-1-B (manufactured by C. Uyemura & Co., Ltd.) (concentration: 30 ml/l), and sodium hydroxide (concentration: 1 g/l) at 60° C. for 5 minutes.

Then, after washing with water in the same manner as mentioned above, the substrate was dipped in a solution of Reducer MRD-2-A (manufactured by C. Uyemura & Co., Ltd.) (concentration: 18 ml/I) and Reducer MRD-2-C (manufactured by C. Uyemura & Co., Ltd.) (concentration: 60 ml/l) at 35° C. for 5 minutes to reduce the plating catalyst. The ten-point average roughness (Rzjis) and the average roughness (Ra) of the outermost surface of the insulation layer of the multilayer substrate, of which the surface adsorbed the plating catalyst and was pretreated for plating, were evaluated. The evaluation results are shown in Table 1.

The multilayer substrate obtained in this manner was dipped in an electroless plating solution containing THRU-CUP PRX-1-A (manufactured by C. Uyemura & Co., Ltd.) (concentration: 150 ml/l), THRU-CUP PRX-1-B (manufactured by C. Uyemura & Co., Ltd.) (concentration: 100 ml/l), and THRU-CUP PRX-1-C (manufactured by C. Uyemura & Co., Ltd.) (concentration: 20 ml/l) at 25° C. and plated for 15 minutes while bubbling air into the solution. The multilayer substrate in which a metal thin film layer has been formed by the electroless plating was washed with water, dried, and rust-prevented in the same manner as described above, thereby obtaining a multilayer substrate in which the electroless plating film was formed.

A commercially available dry film of photosensitive resist attached to the rust-prevented surface of the multilayer substrate by heat-pressing. Then, a mask with a pattern corresponding to the pattern for adhesion evaluation was attached to the dry film, followed by irradiation and development to obtain a resist pattern. Next, the obtained multilayer substrate was dipped in a solution of sulfuric acid (concentration: 100 g/l) for one minute at 25° C. to remove the rust preventive. Electrolysis copper plating was provided in the area in which the resist was not formed, thereby forming an electrolysis copper plating film with a thickness of 18 μm. The resist pattern was removed using a resist separating solution, followed by etching using a mixed solution of cupric chloride and hydrochloric acid to form a circuit pattern of the metal thin film and the electrolysis copper plating film, thereby obtaining a multilayer circuit board with circuit patterns on both side. The board was annealed at 170° C. for 30 minutes to obtain a multilayer printed wiring board. Patterning properties and plating adhesion of the multilayer printed wiring board were evaluated. The evaluation results are shown in Table 1.

Example 2

100 parts of the modified hydrogenated polymer, 40 parts of bisphenol A bis(propylene glycol glycidyl ether)ether, 5 parts of 2-[2-hydroxy-3,5-bis($\alpha,\alpha$-dimethylbenzyl)phenyl] benzotriazole, 0.1 part 1-benzyl-2-phenylimidazole, and 30 parts of "Softon 3200" (manufactured by Shiraishi Calcium Kaisha, Ltd.) with a volume average diameter of 0.8 μm as fillers soluble in an oxidation treatment solution were dissolved in a mixed solvent of 215 parts of xylene and 54 parts of cyclopentanone to obtain varnish of a curable resin composition. The mixture was processed in a planetary stirring mill using zirconia beads with a diameter of 0.3 mm to disperse the components and, after removing the beads, filtered using a filter with a pore size of 10 μm to obtain a varnish. A multilayer printed wiring board was prepared in the same manner as in Example 1, except for using the varnish. The evaluation results are shown in Table 1.

Example 3

100 parts of the modified hydrogenated polymer, 40 parts of bisphenol A bis(propylene glycol glycidyl ether)ether, 5 parts of 2-[2-hydroxy-3,5-bis($\alpha,\alpha$-dimethylbenzyl)phenyl] benzotriazole, 0.1 part of 1-benzyl-2-phenylimidazole, 10 parts of liquid polybutadiene ("B-1000" manufactured by Nippon Petrochemicals, Co., Ltd.) as a resin soluble in an oxidation treatment solution, and 5 parts of "SC1050" (manufactured by ADMATECHS CO., LTD.) with a volume average diameter of 0.2 μm as a filler scarcely soluble in an oxidation treatment solution, were dissolved in a mixed solvent of 215 parts of xylene and 54 parts of cyclopentanone to obtain a varnish of a curable resin composition.

The mixture was processed in a planetary stirring mill using zirconia beads with a diameter of 0.3 mm to disperse the components and, after removing the beads, filtered using a filter with a pore size of 10 μm to obtain a varnish. A multilayer printed wiring board was prepared in the same manner as in Example 1, except for using the varnish. The evaluation results are shown in Table 1.

Comparative Example 1

The experiment for preparing a multilayer printed wiring board was carried out in the same manner as Example 1, except for omitting the step of dipping the substrate after second pressing in a 0.3% 1-(2-aminoethyl)-2-methylimidazole aqueous solution at 30° C. for 10 minutes. It was confirmed that the electroless plating deposited only partly and a part of the plated film exfoliated in the electrolysis plating solution due to inadequate adhesion. The evaluation results are shown in Table 1.

Comparative Example 2

A multilayer circuit board was prepared in the same manner as in Example 1 except that 70 parts of epoxy resin ("Epicoat 1000" manufactured by Yuka Shell Epoxy Kabushiki Kaisha, Mw=1,300) and a polyamide resin ("Macromelt 6217" manufactured by Henkel Hakusui Corp.) were used instead of the modified hydrogenated polymer and the step of dipping the substrate in a 0.3% 1-(2-aminoethyl)-2-methylimidazole aqueous solution at 30° C. for 10 minutes was omitted. The evaluation results are shown in Table 1.

TABLE 1

|  | Example | | | Comparative Example | |
|---|---|---|---|---|---|
|  | 1 | 2 | 3 | 1 | 2 |
| Surface average roughness (Ra) (μm) | 0.07 | 0.07 | 0.09 | 0.06 | 1.3 |
| Surface ten point average roughness (Rzjis) (μm) | 1.68 | 0.94 | 1.33 | 1.5 | 8.3 |
| Patterning | A | A | A | C | C |
| Adhesiveness of metal wiring layer | A | A | A | No good | A |

The results shown in Table 1 indicate that stable adhesion of an electrical insulation layer and a second conductive layer formed thereon and excellent patterning properties can be obtained even in a large size substrate by forming an electrical insulation layer by causing the surface of uncured or partly-cured resin layer to come in contact with a compound having a structure capable of coordinating with a metal before curing, and forming the conductive layer on the surface of the electrical insulation layer of which the surface average roughness (Ra) and the surface ten point average roughness (Rzjis) are controlled by surface oxidation in the range specified in the present invention (Examples 1-3). On the other hand, when the surface of the uncured or partly-cured resin layer was not caused to come in contact with a compound having a structure capable of coordinating with a metal (Comparative Example 1), the patterning was bad and adhesiveness was poor. Patterning was also bad in an experiment in which a mixture of an epoxy resin and a polyamide resin was used as the resin and the electrical insulation layer was prepared without causing the surface of uncured or partly-cured resin layer to come in contact with a compound having a structure capable of coordinating with a metal, and the surface average roughness (Ra) and the surface ten point average roughness (Rzjis) were not controlled by surface oxidation in the range specified in the present invention (Comparative Example 2).

INDUSTRIAL APPLICABILITY

A multilayer printed wiring board with excellent adhesion (pattern adhesion) of an electrical insulation layer with a conductive pattern of a second conductive layer formed thereon can be efficiently produced using the process of the present invention. The multilayer printed wiring board produced by the process of the present invention can be used in electronic equipment such as a computer and cellular phone as a substrate for mounting semiconductor devices such as a CPU and memory, and other mounting parts.

The invention claimed is:
1. A process for producing a multilayer printed wiring board, comprising the steps of:
   causing the surface of a resin layer, which is uncured or partly-cured and made of a curable composition comprising an insulation polymer and a curing agent, to come in contact with
   i) a liquid heterocyclic compound containing a nitrogen atom, an oxygen atom, or a sulfur atom, in the ring thereof and having an amino group, thiol group, carboxyl group or cyano group or ii) a solution of a heterocyclic compound containing a nitrogen atom, an oxygen atom, or a sulfur atom, in the ring thereof and having an amino group, thiol group, carboxyl group or cyano group as a main component;

the resin layer being formed on an internal layer substrate comprising a formed body of an electrical insulation material and a first conductive layer as the outermost layer, which is formed on the formed body;

subsequently, curing the resin layer to form an electrical insulation layer wherein the surface of the obtained electrical insulation layer is the same as the surface of the resin layer;

oxidizing the surface of the obtained electrical insulation layer until the surface average roughness of the electrical insulation layer becomes within the range not less than 0.05 μm and less than 0.2 μm and the surface ten-point average roughness thereof within the range not less than 0.3 μm and less than 4 μm;

and thereafter forming a second conductive layer on the electrical insulation layer using a plating method.

2. The process according to claim 1, wherein the method of oxidizing the surface of the electrical insulation layer comprises causing the surface of the electrical insulation layer to come in contact with a solution of an oxidizing compound selected from the group consisting of permanganates, chromates, and dichromates.

3. The process according to claim 2, wherein the electrical insulation layer comprises a resin and/or filler soluble in the solution of the oxidizing compound.

4. The process according to claim 1, further comprising the step of forming a metal thin film layer on the electrical insulation layer by electroless plating.

5. The process according to claim 4, further comprising the step of heating the metal thin film layer formed on the electrical insulation layer.

* * * * *